United States Patent
Moore et al.

(10) Patent No.: US 9,203,412 B1
(45) Date of Patent: Dec. 1, 2015

(54) TECHNIQUES FOR BYPASSING CIRCUITS DURING TESTS

(71) Applicant: Altera Corporation, San Jose, CA (US)

(72) Inventors: Christopher Moore, Saratoga, CA (US); Simardeep Maangat, San Jose, CA (US)

(73) Assignee: Altera Corporation, San Jose, CA (US)

( * ) Notice: Subject to any disclaimer, the term of this patent is extended or adjusted under 35 U.S.C. 154(b) by 114 days.

(21) Appl. No.: 14/025,199

(22) Filed: Sep. 12, 2013

(51) Int. Cl.
*H03K 19/173* (2006.01)

(52) U.S. Cl.
CPC .................... *H03K 19/173* (2013.01)

(58) Field of Classification Search
CPC ........... H03K 19/00361; H03K 17/167; G01R 31/31924
USPC ......................................... 327/108, 109, 110
See application file for complete search history.

(56) References Cited

U.S. PATENT DOCUMENTS

| | | | |
|---|---|---|---|
| 6,480,575 B2 | 11/2002 | Chea, Jr. et al. | |
| 7,791,370 B1 | 9/2010 | Hoang et al. | |
| 2009/0212882 A1* | 8/2009 | de la Puente et al. | 333/100 |

FOREIGN PATENT DOCUMENTS

WO     02/09407     1/2002

* cited by examiner

*Primary Examiner* — John Poos
(74) *Attorney, Agent, or Firm* — Steven J. Cahill

(57) ABSTRACT

A circuit includes first and second signal networks, a driver circuit, and a bypass circuit. The driver circuit generates a first signal based on a second signal during a normal mode. The second signal is received from the first signal network. The bypass circuit is coupled to the driver circuit to provide a third signal generated based on the first signal to the second signal network during the normal mode. The bypass circuit receives a fourth signal from the first signal network during a test mode. The bypass circuit generates a fifth signal based on the fourth signal. The fifth signal is provided to the second signal network during the test mode. The bypass circuit prevents the driver circuit from driving a signal to the second signal network during the test mode.

21 Claims, 7 Drawing Sheets

US 9,203,412 B1

TECHNIQUES FOR BYPASSING CIRCUITS DURING TESTS

FIELD OF THE DISCLOSURE

The present disclosure relates to electronic circuits, and more particularly, to techniques for bypassing circuits during tests.

BACKGROUND

A field programmable gate array (FPGA) is an integrated circuit that contains programmable logic circuits. An FPGA also has programmable signal networks that can be configured to route signals between circuits in the integrated circuit. An FPGA typically includes phase-locked loops and/or delay-locked loops that generate periodic clock signals. The clock signals are transmitted through clock networks in the FPGA. The clock networks are configurable to provide the clock signals to selected ones of the programmable logic circuits.

BRIEF SUMMARY

According to some embodiments, a circuit includes first and second signal networks, a driver circuit, and a bypass circuit. The driver circuit generates a first signal based on a second signal during a normal mode. The second signal is received from the first signal network. The bypass circuit is coupled to the driver circuit to provide a third signal generated based on the first signal to the second signal network during the normal mode. The bypass circuit receives a fourth signal from the first signal network during a test mode. The bypass circuit generates a fifth signal based on the fourth signal. The fifth signal is provided to the second signal network during the test mode. The bypass circuit prevents the driver circuit from driving a signal to the second signal network during the test mode.

Various objects, features, and advantages of the present invention will become apparent upon consideration of the following detailed description and the accompanying drawings.

DETAILED DESCRIPTION

Many integrated circuits have signal networks that transmit signals between circuits in the integrated circuit. Signal networks in an integrated circuit may be tested prior to operation. Testing a signal network may involve verification with low frequency signals or high frequency signals. However, some driver circuits that drive signals to signal networks in an integrated circuit are not designed to generate output signals below a minimum frequency. If a driver circuit has a minimum frequency in its output signal, the driver circuit cannot provide an output test signal having a frequency that is less than its minimum frequency to a signal network during a test mode.

According to some embodiments described herein, a bypass circuit bypasses a driver circuit having a minimum frequency during a test of a signal network using a low frequency test signal. The driver circuit receives an input signal from a first signal network during a normal mode of the driver circuit. The driver circuit drives an output signal to a second signal network during the normal mode. The bypass circuit is coupled to the first and the second signal networks. A low frequency test signal is provided from the first signal network through the bypass circuit to the second signal network during a test mode to test the first and the second signal networks. The output of the driver circuit is decoupled from the second signal network during the test mode.

Figure 1:
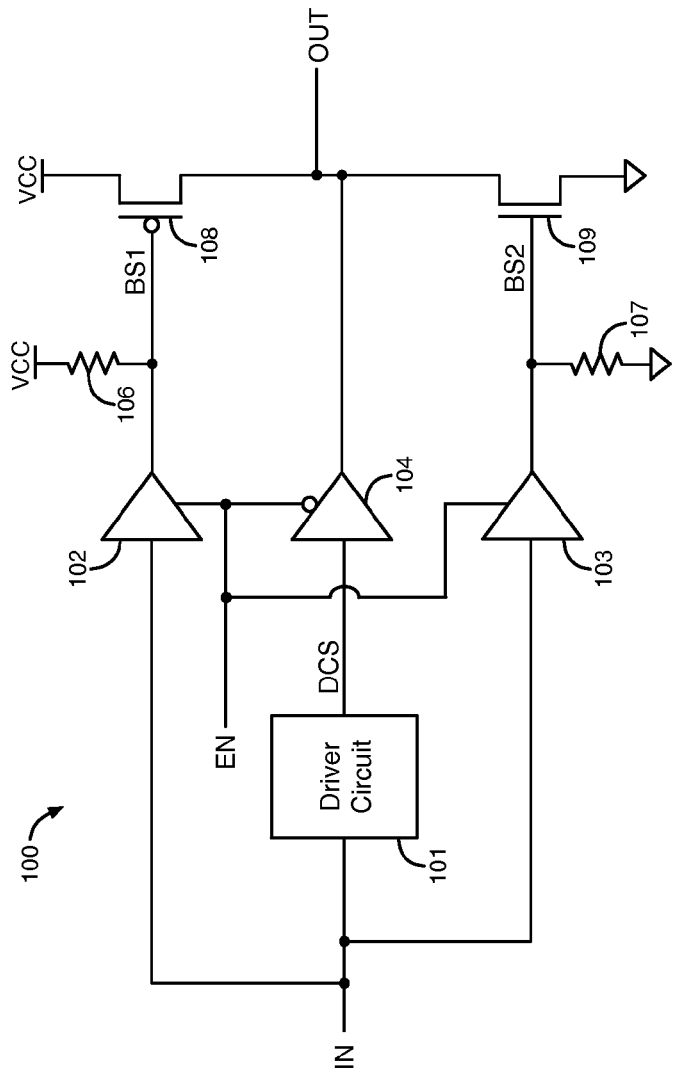
FIG. 1 illustrates an example of a bypass circuit that can be used to bypass a driver circuit having a minimum frequency during a test of a signal network using a low frequency test signal, according to an embodiment of the present invention.

FIG. 1 illustrates an example of a bypass circuit that can be used to bypass a driver circuit having a minimum frequency during a test of a signal network using a low frequency test signal, according to an embodiment of the present invention. Driver/bypass circuit 100 in FIG. 1 includes a driver circuit 101 and a bypass circuit. The bypass circuit of FIG. 1 includes three buffer circuits 102-104, resistors 106-107, p-channel field-effect transistor 108, and n-channel field-effect transistor 109. Transistors 108-109 may be, for example, metal oxide semiconductor field-effect transistors (MOSFETs).

An input signal IN is provided to an input of driver circuit 101 from a first signal network. Driver circuit 101 generates an output signal DCS based on the input signal IN during the normal mode of driver circuit 101. Signals IN and DCS may be, for example, periodic clock signals. As another example, signals IN and DCS may be data signals. Driver circuit 101 may be any type of circuit that generates a minimum frequency in its output signal DCS. For example, driver circuit 101 may be a phase-locked loop (PLL) circuit, a clock data recovery (CDR) circuit, a delay-locked loop (DLL) circuit, a counter circuit, an oscillator circuit, or a dynamic logic circuit.

Input signal IN is also provided to inputs of buffer circuits 102-103. The output signal DCS of driver circuit 101 is provided to an input of buffer circuit 104. A digital enable signal EN is provided to non-inverting enable inputs of buffer circuits 102-103 and to an inverting enable input of buffer circuit 104. The enable signal EN controls when buffer circuits 102-104 are enabled and disabled. During the normal mode of driver circuit 101, the enable signal EN is in a logic low state, buffer circuit 104 is enabled, and buffer circuits 102-103 are disabled. Resistor 106 is coupled between the gate of transistor 108 and a node at a supply voltage VCC. Resistor 107 is coupled between the gate of transistor 109 and a node at a ground voltage.

When buffer circuit 102 is disabled in the normal mode, buffer circuit 102 does not adjust the voltage BS1 at the gate of p-channel transistor 108 based on input signal IN. Therefore, current through resistor 106 pulls the voltage BS1 at the gate of transistor 108 to supply voltage VCC to maintain transistor 108 off while buffer circuit 102 is disabled. When buffer circuit 103 is disabled in the normal mode, buffer circuit 103 does not adjust the voltage BS2 at the gate of n-channel transistor 109 based on input signal IN. Therefore, current through resistor 107 pulls the voltage BS2 at the gate of transistor 109 to the ground voltage to maintain transistor 109 off while buffer circuit 103 is disabled.

When buffer circuit 104 is enabled in the normal mode, buffer circuit 104 buffers the output signal DCS of driver circuit 101 to generate a buffered output signal OUT. Output signal OUT is provided to a second signal network. Output signal OUT is the same type of signal as signal DCS. For example, if signal DCS is a periodic clock signal, output signal OUT is also a periodic clock signal, and the first and second signal networks are clock networks. As another example, if signal DCS is a data signal indicating bits, output signal OUT is also a data signal that indicates the same bits as signal DCS, and the first and second signal networks are data networks.

The bypass circuit of FIG. 1 allows the first and second signal networks to be tested using a test signal having a frequency that is less than the minimum frequency of driver circuit 101. The minimum frequency of driver circuit 101 is the minimum frequency that driver circuit 101 can generate in its output signal DCS. A test of the first and the second signal networks using a test signal having a frequency that is less than the minimum frequency of driver circuit 101 is referred to herein as a low frequency test. A low frequency test of the signal networks may be performed during a test mode. A low frequency test may be used to test a variety of signal networks in any type of integrated circuit.

As an example, the programmable logic connections that couple together the conductors in each signal network in an FPGA may be tested prior to the user mode of the FPGA. A low frequency test may, for example, be used to verify that the appropriate configuration bits have been enabled in the FPGA to correctly establish the desired connectivity of the programmable logic connections in the signal networks. As a more specific example, a high-speed clock network driven by a phase-locked loop circuit may be tested using a low frequency test signal. Some embodiments disclosed herein provide the ability to bypass the analog portion of the phase-locked loop circuit to allow signal network topologies that are nearly the same as a user configuration to be created and verified using one or more low frequency test signals. Low frequency testing of signal networks may, for example, be used in FPGA architectures having high-speed serial interface clock networks that operate in the multi-gigahertz range during user mode.

During a low frequency test of the first and the second signal networks coupled to driver/bypass circuit 100, the enable signal EN is in a logic high state to enable the bypass circuit of FIG. 1 in test mode and to prevent driver circuit 101 from driving a signal to the second signal network. When the bypass circuit of FIG. 1 is enabled, the bypass circuit of FIG. 1 bypasses driver circuit 101 by providing an inverted value of input signal IN to the second signal network in output signal OUT during a low frequency test of the first and the second signal networks.

When the enable signal EN is in a logic high state, buffer circuit 104 is disabled, and buffer circuits 102-103 are enabled to function in test mode. When buffer circuit 102 is enabled, buffer circuit 102 buffers input signal IN to generate a buffered signal BS1 at the gate of p-channel transistor 108. When buffer circuit 103 is enabled, buffer circuit 103 buffers input signal IN to generate a buffered signal BS2 at the gate of n-channel transistor 109. When buffer circuit 104 is disabled, buffer circuit 104 does not affect the voltage of output signal OUT based on signal DCS. The bypass circuit of FIG. 1 prevents driver circuit 101 from driving a signal to the second signal network during the test mode.

Transistors 108-109 operate as an inverter circuit when buffer circuits 102-103 are enabled. When input signal IN is in a logic low state, buffer circuit 102 drives buffered signal BS1 to a logic low state, causing p-channel transistor 108 to be on, and buffer circuit 103 drives buffered signal BS2 to a logic low state, causing n-channel transistor 109 to be off. The source of transistor 108 is coupled to a node at supply voltage VCC. Thus, when transistor 108 is on and transistor 109 is off, transistor 108 pulls the voltage of output signal OUT to supply voltage VCC, which indicates a logic high state.

When input signal IN is in a logic high state, buffer circuit 102 drives buffered signal BS1 to a logic high state, causing p-channel transistor 108 to be off, and buffer circuit 103 drives buffered signal BS2 to a logic high state, causing n-channel transistor 109 to be on. The source of transistor 109 is coupled to a node at the ground voltage. Thus, when transistor 108 is off and transistor 109 is on, transistor 109 pulls the voltage of output signal OUT to the ground voltage, which indicates a logic low state. Thus, the bypass circuit of FIG. 1 provides an inverted value of input signal IN to output signal OUT during the test mode. In the test mode, the frequency of output signal OUT is less than the minimum frequency of driver circuit 101. In an embodiment, transistors 108-109 are small transistors (e.g., the smallest transistors that satisfy the performance requirements) that minimize parasitic capacitance affecting the output signal OUT during the normal mode of driver circuit 101.

Figure 2:
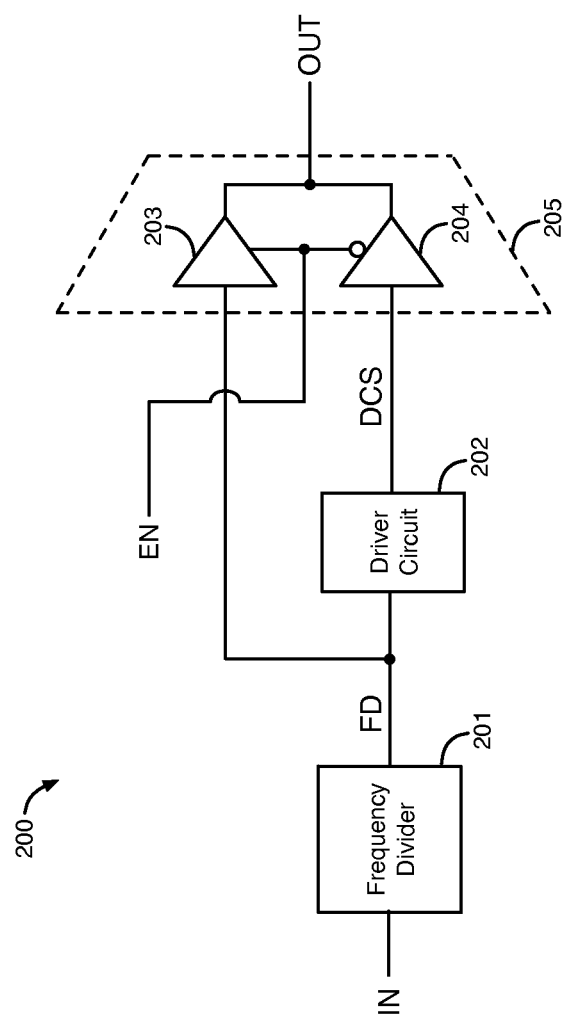
FIG. 2 illustrates another example of a bypass circuit that can be used to bypass a driver circuit having a minimum frequency during a test of a signal network using a low frequency test signal, according to an alternative embodiment of the present invention.

FIG. 2 illustrates another example of a bypass circuit that can be used to bypass a driver circuit having a minimum frequency during a test of a signal network using a low frequency test signal, according to an embodiment of the present invention. Driver/bypass circuit 200 in FIG. 2 includes a frequency divider circuit 201, a driver circuit 202, and a bypass circuit 205. Bypass circuit 205 is a multiplexer circuit that includes two buffer circuits 203-204.

An input signal IN is provided to an input of frequency divider circuit 201 from a first signal network. Frequency divider circuit 201 generates a frequency divided signal FD based on input signal IN. Frequency divider circuit 201 divides the frequency of input signal IN by a frequency division value that is greater than 1 to generate the frequency of frequency divided signal FD. Signal FD is provided to an input of driver circuit 202. Driver circuit 202 generates an output signal DCS based on signal FD during the normal mode. The minimum frequency of driver circuit 202 is the minimum frequency that driver circuit 202 can generate in its output signal DCS. Signals IN, FD, and DCS may be, for example, periodic clock signals. Frequency divider circuit 201 may be, for example, a counter circuit.

In an alternative embodiment, frequency divider circuit 201 is eliminated from circuit 200, input signal IN is provided directly to the input of driver circuit 202, and driver circuit 202 generates signal DCS based on signal IN. In this alternative embodiment, signals IN and DCS may be data signals or periodic clock signals.

Driver circuit 202 may be any type of circuit that generates a minimum frequency in output signal DCS. For example, driver circuit 202 may be a phase-locked loop (PLL) circuit, a delay-locked loop (DLL) circuit, a clock data recovery (CDR) circuit, a counter circuit, an oscillator circuit, or a dynamic logic circuit. In an embodiment in which driver circuit 202 is a PLL, signal FD may be provided to an input of a phase frequency detector circuit in the PLL, and signal DCS may be a clock signal generated by a voltage-controlled oscillator (VCO) in the PLL or a counter circuit in the PLL that divides a frequency of an output clock signal of the VCO.

Signal FD is also provided to an input of buffer circuit 203. The output signal DCS of driver circuit 202 is provided to an input of buffer circuit 204. A digital enable signal EN is provided to the non-inverting enable input of buffer circuit 203 and to an inverting enable input of buffer circuit 204. The enable signal EN controls when buffer circuits 203-204 are enabled and disabled.

During the normal mode of driver circuit 202, the enable signal EN is in a logic low state, buffer circuit 204 is enabled, and buffer circuit 203 is disabled. When buffer circuit 204 is enabled in the normal mode, buffer circuit 204 buffers the output signal DCS of driver circuit 202 to generate a buffered output signal OUT at the output of bypass circuit 205. Output signal OUT is provided to a second signal network. When buffer circuit 203 is disabled, buffer circuit 203 does not affect the voltage of output signal OUT based on signal FD.

Output signal OUT is the same type of signal as signal DCS. For example, if signal DCS is a periodic clock signal, output signal OUT is also a periodic clock signal, and the first and second signal networks are clock networks. In the embodiment without frequency divider circuit 201, if signal DCS is a data signal indicating bits, output signal OUT is also a data signal that indicates the same bits as signal DCS, and the first and second signal networks are data networks.

Bypass circuit 205 allows the first and second signal networks to be tested using a test signal having a frequency that is less than the minimum frequency of driver circuit 202 during a test mode. During the test mode, the enable signal EN is in a logic high state. When the enable signal EN is in a logic high state, buffer circuit 203 is enabled to provide a bypass circuit path around driver circuit 202, and buffer circuit 204 is disabled to prevent driver circuit 202 from driving a signal to the second signal network. When buffer circuit 203 is enabled during test mode, buffer circuit 203 buffers signal FD to generate a buffered output signal OUT at the output of bypass circuit 205. When buffer circuit 204 is disabled, buffer circuit 204 does not affect the voltage of output signal OUT based on signal DCS. In the test mode, the frequency of output signal OUT is less than the minimum frequency of driver circuit 202.

In an embodiment, the transistors in buffer circuit 203 are small transistors (e.g., the smallest transistors that satisfy the performance requirements) that minimize parasitic capacitance affecting the output signal OUT during the normal mode of driver circuit 202. The transistors in buffer circuit 203 are selected to have a small enough capacitance so that buffer circuit 203 does not reduce the frequency of the output signal OUT below a minimum expected frequency during normal mode. The transistors in buffer circuit 203 are selected to generate a test output signal OUT having a frequency within an expected range of low frequencies during the test mode.

Figure 3:
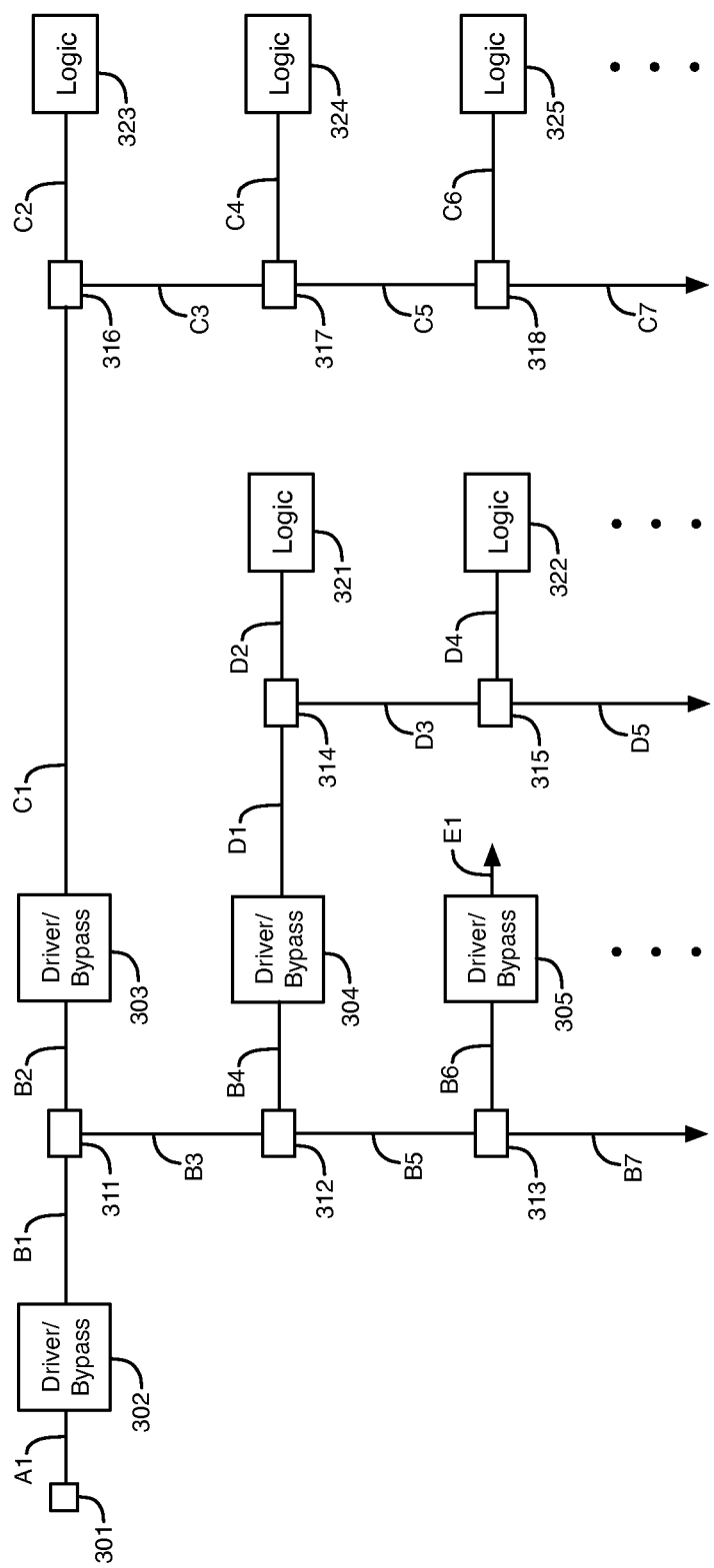
FIG. 3 illustrates examples of signal networks that couple together driver circuits and logic circuits in an integrated circuit, according to an embodiment of the present invention.

FIG. 3 illustrates examples of signal networks that couple together driver circuits and logic circuits on an integrated circuit, according to an embodiment of the present invention. FIG. 3 illustrates a portion of an integrated circuit that includes numerous pads, driver/bypass circuits, logic circuits, and signal networks. Only a subset of the pads, driver/bypass circuits, logic circuits, and signal networks are shown in FIG. 3 to simplify the drawing. FIG. 3 illustrates pad 301, driver/bypass circuits 302-305, logic connection circuits 311-318, logic circuits 321-325, and conductors A1, B1-B7, C1-C7, D1-D5, and E1. The integrated circuit of FIG. 3 also includes many additional pads, driver/bypass circuits, logic circuits, logic connection circuits, and conductors that are not shown in FIG. 3.

Pad 301 and conductor A1 are coupled together as part of a first signal network in FIG. 3. Conductors B1-B7 and logic connection circuits 311-313 are coupled together as part of a second signal network in FIG. 3. Conductors C1-C7 and logic connection circuits 316-318 are coupled together as part of a third signal network in FIG. 3. Conductors D1-D5 and logic connection circuits 314-315 are coupled together as part of a fourth signal network in FIG. 3. Conductor E1 is part of a fifth signal network in FIG. 3. Each of the first, second, third, fourth, and fifth signal networks may include other conductors and logic connection circuits not shown in FIG. 3 that provide signals to other circuits on the integrated circuit.

Pad 301 is an external terminal of the integrated circuit (e.g., a conductive area on a surface of the integrated circuit die). Logic connection circuits 311-318 may be, for example, programmable logic connection circuits that include multiplexer circuits, buffer circuits, and/or conductors. Logic circuits 321-325 may be, for example, programmable logic circuits. Conductors A1, B1-B7, C1-C7, D1-D5, and E1 are shown in FIG. 3 as vertical and horizontal lines.

The driver/bypass circuit 100 shown in FIG. 1 is an example of each of the driver/bypass circuits 302-305. In an embodiment, each of the driver/bypass circuits 302-305 includes an instance of driver/bypass circuit 100. The driver/bypass circuit 200 shown in FIG. 2 is another example of each of the driver/bypass circuits 302-305. In this embodiment, each of the driver/bypass circuits 302-305 includes an instance of driver/bypass circuit 200.

As examples that are not intended to be limiting, the driver circuits in driver/bypass circuits 302-305 may be phase-locked loop (PLL) circuits, delay-locked loop (DLL) circuits, clock data recovery (CDR) circuits, counter circuits, oscillator circuits, dynamic logic circuits, or any combination thereof. As a specific example, the driver circuits in driver/bypass circuits 302-305 may be PLL circuits, and an output clock signal of the PLL in circuit 302 is provided to the PLLs in circuits 303-305 as a reference clock signal during normal mode.

In some embodiments, signal networks in an integrated circuit are tested during a test mode using test signals having frequencies that are less than the minimum frequencies of driver circuits that drive signals to the signal networks during a normal mode. The test signals may, for example, be used to test the integrity and operability of signal paths through logic connection circuits that couple together conductors in the signal networks during test mode.

During the test mode, a test input signal is provided from an external device that is outside the integrated circuit through pad 301 and conductor A1 to an input of driver/bypass circuit 302. The bypass circuit in driver/bypass circuit 302 bypasses the driver circuit to generate a test output signal based on the test input signal received from pad 301 during the test mode, as described above with respect to FIGS. 1-2. The test output signal of driver/bypass circuit 302 is provided to conductor B1. The test output signal of driver/bypass circuit 302 has a frequency that is less than the minimum frequency of the driver circuit in driver/bypass circuit 302.

The test output signal of driver/bypass circuit 302 may be provided to one or more of the driver/bypass circuits that are coupled to the second signal network. For example, logic connection circuits 311-313 may be programmed to provide the test output signal of driver/bypass circuit 302 to inputs of driver/bypass circuits 303-305, respectively, through corresponding ones of conductors B1-B6. The test signals are provided to the inputs of driver/bypass circuits 303-305 through conductors B2, B4, and B6, respectively, during test mode.

Driver/bypass circuit 303 generates a test output signal in conductor C1 based on the test signal received from conductor B2. The bypass circuit in driver/bypass circuit 303 bypasses the driver circuit to generate the test output signal based on the test signal received from conductor B2 during the test mode, as described above with respect to FIGS. 1-2. The frequency of the test output signal in conductor C1 is less than the minimum frequency of the driver circuit in driver/bypass circuit 303. The test output signal of driver/bypass circuit 303 may be provided to one or more of the logic circuits that are coupled to the third signal network. For example, logic connection circuits 316-318 may be programmed to provide the test output signal of driver/bypass circuit 303 to inputs of logic circuits 323-325, respectively, through corresponding ones of conductors C1-C6. Logic circuits 323-325 store the values of the test signals received from conductors C2, C4, and C6, respectively.

Driver/bypass circuit 304 generates a test output signal in conductor D1 based on the test signal received from conductor B4. The bypass circuit in driver/bypass circuit 304 bypasses the driver circuit to generate the test output signal based on the test signal received from conductor B4 during the test mode, as described above with respect to FIGS. 1-2. The frequency of the test output signal in conductor D1 is less than the minimum frequency of the driver circuit in driver/bypass circuit 304. The test output signal of driver/bypass circuit 304 may be provided to one or more of the logic circuits that are coupled to the fourth signal network. For example, logic connection circuits 314-315 may be programmed to provide the test output signal of driver/bypass circuit 304 to inputs of logic circuits 321-322, respectively, through corresponding ones of conductors D1-D4. Logic circuits 321-322 store the values of the test signals received from conductors D2 and D4, respectively.

The bypass circuit in driver/bypass circuit 305 bypasses the driver circuit to generate a test output signal in conductor E1 based on the test signal received from conductor B6. The bypass circuit in driver/bypass circuit 305 generates the test output signal based on the test signal received from conductor B6 during the test mode, as described above with respect to FIGS. 1-2. The frequency of the test output signal in conductor E1 is less than the minimum frequency of the driver circuit in driver/bypass circuit 305. The test output signal of driver/bypass circuit 305 is provided to a fifth signal network in the integrated circuit through conductor E1. Other driver/bypass circuits in the integrated circuit may generate additional test output signals based on test signals received from other driver/bypass circuits through additional signal networks in the integrated circuit.

During the test mode, the values of the test signals stored in the logic circuits in the integrated circuit, such as logic circuits 321-325, are compared to expected values. If the driver/bypass circuits have the inverting bypass circuit structure shown in FIG. 1, then corresponding ones of the expected values are inverted if there are an odd number of bypass circuits between the test input signal received at pin 301 and the corresponding logic circuits. The values of the test signals stored in the logic circuits may, for example, be evaluated using a control circuit or configured programmable logic circuits in the integrated circuit or a test circuit outside the integrated circuit. The values of the test signals stored in the logic circuits 321-325 etc. indicate if signal paths through the logic connection circuits 311-318 etc. are operable to couple together conductors in the second, third, fourth, etc. signal networks to implement desired connections.

The desired connections of the signal networks in the integrated circuit may be configurable by a user if the signal networks are configurable (e.g., in an FPGA). If the integrated circuit is an FPGA, the test mode may follow the configuration mode and precede the normal mode. The programmable logic connection circuits and the other programmable logic circuits in an FPGA are configured during configuration mode by configuration bits. In an FPGA, a test mode using low frequency test signals as described herein may be used to verify that the configuration bits have been enabled to correctly establish the desired connectivity of one or more of the configurable signal networks in the FPGA. Normal mode as described herein may correspond to the user mode in an FPGA.

Alternatively, the desired connections of the signal networks in the integrated circuit may be fixed according to the design of the integrated circuit and unalterable by a user. An application specific integrated circuit typically has signal networks with fixed connections.

During normal mode, an input signal is provided from an external device that is outside the integrated circuit through pad 301 and conductor A1 to an input of driver/bypass circuit 302. The driver circuit in circuit 302 generates an output signal based on the input signal received from conductor A1 during normal mode. Driver/bypass circuit 302 generates an output signal on conductor B1 that is based on the output signal of the driver circuit in circuit 302 during normal mode, as described above with respect to FIGS. 1-2.

Logic connection circuits 311-313 etc. may be programmed to provide the output signal of driver/bypass circuit 302 to the driver/bypass circuits 303-305 etc. coupled to the second signal network during normal mode. The driver circuits in circuits 303-305 generate output signals based on the input signals received from conductors B2, B4, and B6, respectively, during normal mode. Driver/bypass circuits 303, 304, and 305 generate output signals on conductors C1, D1, and E1 during normal mode that are based on the output signals of the driver circuits in circuits 303-305, respectively, as described above with respect to FIGS. 1-2. The output signals of driver/bypass circuits 303-305 are provided through the third, fourth, and fifth signal networks, respectively, to other circuits in the integrated circuit, such as logic circuits 321-325.

Figure 4A:
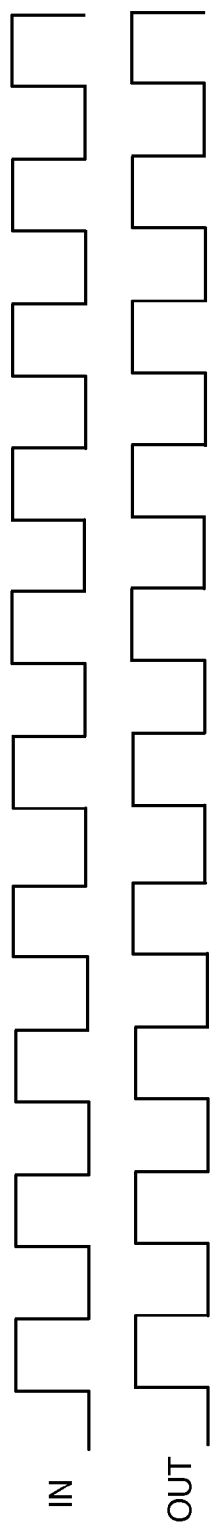
FIG. 4A is a timing diagram that illustrates examples of waveforms for the input and output signals of a driver/bypass circuit during a normal mode, according to an embodiment of the present invention.

FIG. 4A is a timing diagram that illustrates examples of waveforms for the input and output signals of a driver/bypass circuit during normal mode, according to an embodiment of the present invention. The waveforms shown in FIG. 4A are examples of waveforms for the IN and OUT signals shown in and described herein with respect to FIGS. 1-2. In the example of FIG. 4A, the driver circuit is in normal mode, the bypass circuit is disabled, and the input signal IN to the driver circuit is a periodic clock signal having a relatively high frequency. As an example that is not intended to be limiting, input signal IN and output signal OUT may have frequencies in the range of 1-10 gigahertz or more. In the example of FIG.

4A, the output signal OUT is a periodic clock signal that has the same frequency as the input signal IN.

Figure 4B:
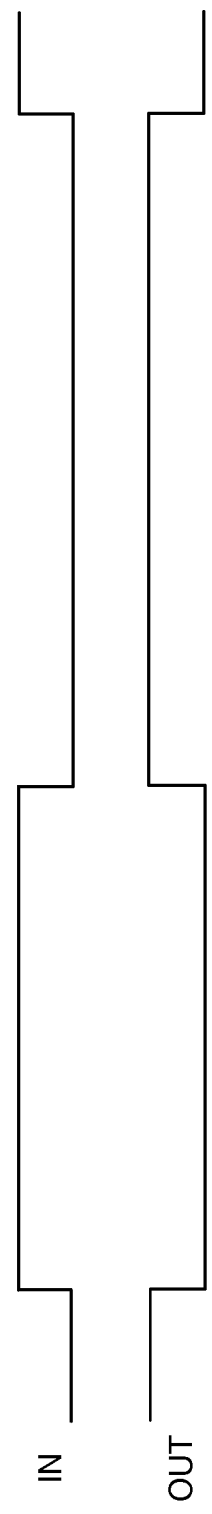
FIG. 4B is a timing diagram that illustrates examples of waveforms for the input and output signals of a driver/bypass circuit during a test mode using a low frequency test signal, according to an embodiment of the present invention.

FIG. 4B is a timing diagram that illustrates examples of waveforms for the input and output signals of a driver/bypass circuit during a test mode using a low frequency test signal, according to an embodiment of the present invention. The waveforms shown in FIG. 4B are examples of waveforms for the IN and OUT signals shown in and described herein with respect to the driver/bypass circuit 100 of FIG. 1. In the example of FIG. 4B, the bypass circuit is enabled to create a bypass circuit path around the driver circuit 101 during a low frequency test of the signal networks. The input signal IN to the bypass circuit is a periodic clock signal having a relatively low frequency. As an example that is not intended to be limiting, input signal IN may have a frequency in the range of kilohertz to megahertz. The output signal OUT of the bypass circuit is an inverted periodic clock signal that has the same frequency as the input signal IN. The waveforms in FIG. 4B may be examples of waveforms for the IN and OUT signals disclosed herein with respect to driver/bypass circuit 200 of FIG. 2 if buffer circuit 203 is inverting.

Figure 5:
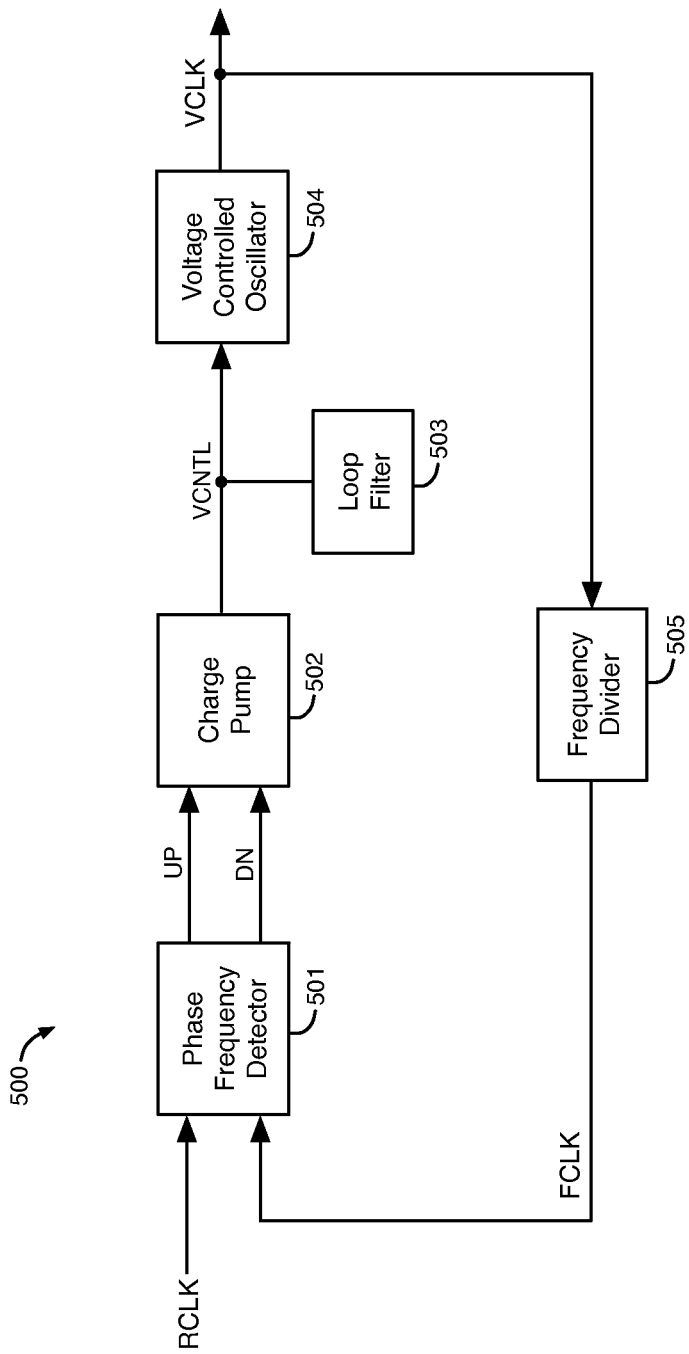
FIG. 5 illustrates an example of a phase-locked loop (PLL) circuit that can be used with embodiments of the present invention.

FIG. 5 illustrates an example of a phase-locked loop (PLL) circuit 500 that can be used with embodiments of the present invention. PLL circuit 500 is an example of each of the driver circuits 101 and 202 shown in and described herein with respect to FIGS. 1-2. PLL circuit 500 includes a phase frequency detector (PFD) circuit 501, a charge pump circuit 502, a loop filter circuit 503, a voltage controlled oscillator (VCO) circuit 504, and a frequency divider circuit 505.

PFD circuit 501 compares the phase and the frequency of a reference clock signal RCLK to the phase and the frequency of a feedback clock signal FCLK to generate phase error signals UP and DN. Charge pump circuit 502 generates a control voltage VCNTL based on the phase error signals UP and DN. Loop filter circuit 503 low pass filters the control voltage VCNTL. VCO circuit 504 generates output clock signals, including clock signal VCLK. VCO circuit 504 varies the frequency of clock signal VCLK and the frequencies of its other output clock signals based on changes in the control voltage VCNTL. Frequency divider circuit 505 generates feedback clock signal FCLK based on clock signal VCLK. Frequency divider circuit 505 divides the frequency of clock signal VCLK by a number greater than 1 to generate the frequency of feedback clock signal FCLK. In an embodiment, clock signal RCLK is the input signal IN to driver circuit 101, and clock signal VCLK is the output signal DCS of driver circuit 101. In another embodiment, clock signal RCLK is the input signal FD to driver circuit 202, and clock signal VCLK is the output signal DCS of driver circuit 202.

Figure 6:
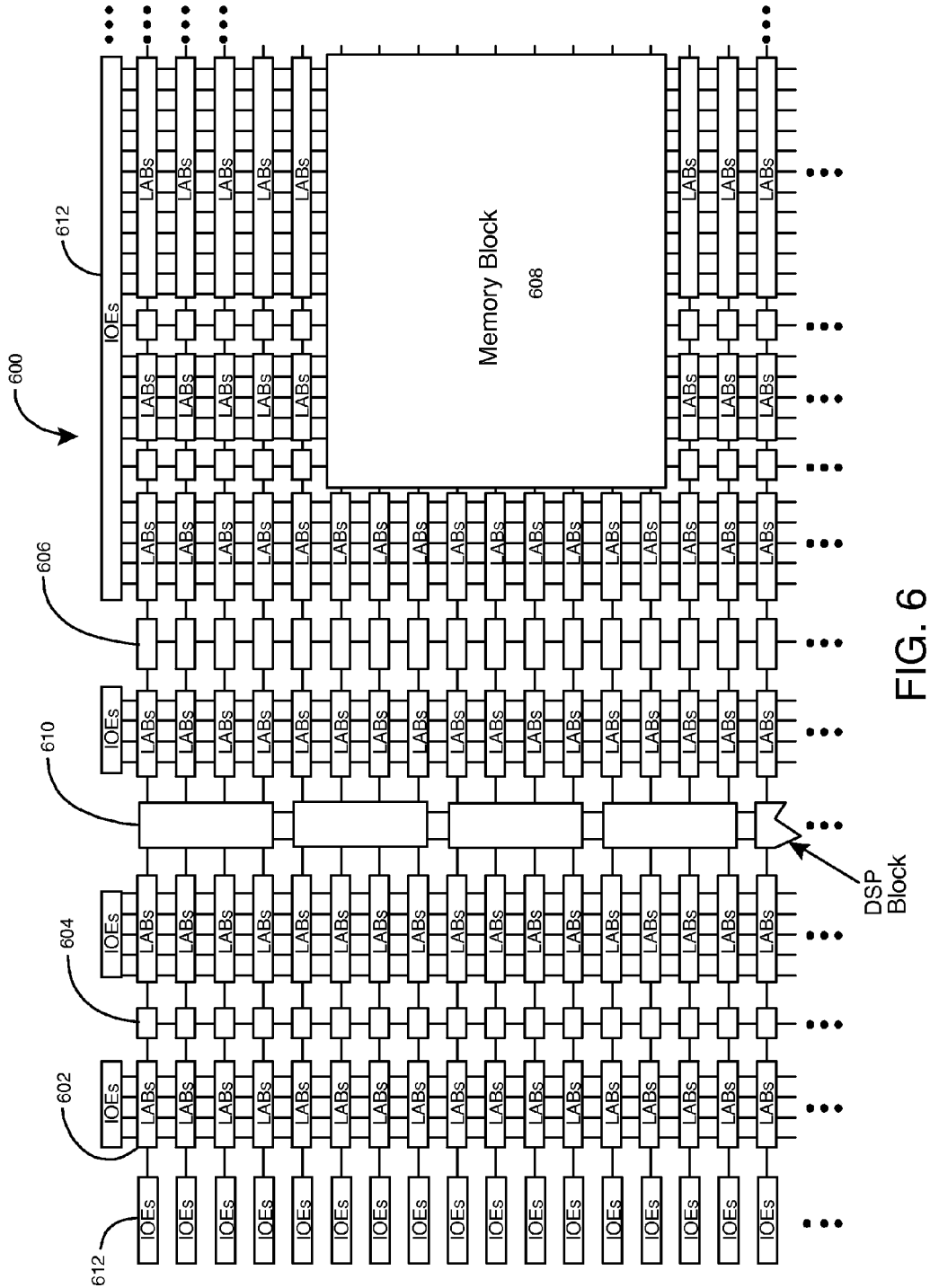
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes an array of programmable logic array blocks (or LABs) 602 that are interconnected by a signal network of column and row interconnect conductors of varying length and speed. LABs 602 include multiple (e.g., 10) logic elements (or LEs).

A logic element (LE) is a programmable logic circuit that provides for efficient implementation of user defined logic functions. An FPGA has numerous logic elements that can be configured to implement various combinatorial and sequential functions. The logic elements have access to a programmable interconnect structure of signal networks. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) blocks 610 that can implement, for example, multipliers with add or subtract features. Input/output elements (IOEs) 612 support numerous single-ended and differential input/output standards. IOEs 612 include input and output buffers that are coupled to pads of the integrated circuit. The pads are external terminals of the FPGA die that can be used to route, for example, input signals, output signals, and supply voltages between the FPGA and one or more external devices. FPGA 600 may also include driver/bypass circuits as shown in FIGS. 1-3. FPGA 600 is described herein for illustrative purposes. Embodiments of the present invention can be implemented in many different types of integrated circuits.

Figure 7:
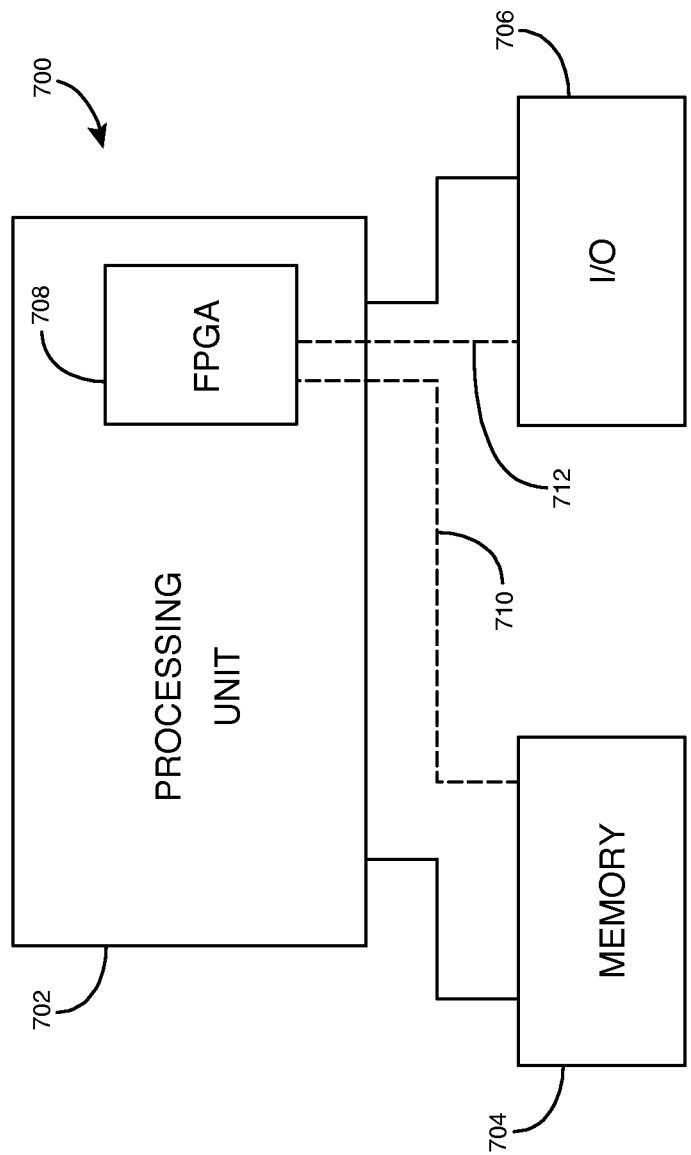
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
first and second signal networks;
a first driver circuit to generate a first signal based on a second signal during a normal mode, wherein the second signal is received from the first signal network; and
a first bypass circuit coupled to the first driver circuit to provide a third signal generated based on the first signal to the second signal network during the normal mode,
wherein the first bypass circuit receives a fourth signal from the first signal network during a test mode, wherein the first bypass circuit generates a fifth signal based on the fourth signal and provides the fifth signal to the second signal network during the test mode, and wherein the first bypass circuit prevents the first driver circuit from driving a signal to the second signal network during the test mode.

2. The circuit of claim 1, wherein the first driver circuit generates a minimum frequency in the first signal during the normal mode, and wherein the fifth signal has a frequency that is less than the minimum frequency of the first driver circuit during the test mode.

3. The circuit of claim 1, wherein the first bypass circuit comprises first and second buffer circuits coupled to the first signal network, and a third buffer circuit coupled to an output of the first driver circuit, wherein the first and the second buffer circuits are enabled during the test mode and disabled during the normal mode, and wherein the third buffer circuit is enabled during the normal mode and disabled during the test mode.

4. The circuit of claim 3, wherein the first bypass circuit provides the fifth signal to the second signal network using first and second transistors, wherein the first transistor is coupled between an output of the first buffer circuit and the second signal network, and wherein the second transistor is coupled between an output of the second buffer circuit and the second signal network.

5. The circuit of claim 4, wherein the first bypass circuit further comprises a first resistor coupled between the output of the first buffer circuit and a node at a supply voltage, and wherein the first bypass circuit further comprises a second resistor coupled between the output of the second buffer circuit and a node at a ground voltage.

6. The circuit of claim 1, wherein the second signal network comprises connection circuits, and wherein the connection circuits in the second signal network are tested during the test mode.

7. The circuit of claim 1, wherein the first bypass circuit comprises a multiplexer circuit, wherein the multiplexer circuit comprises a first buffer circuit coupled to an input of the first driver circuit, wherein the multiplexer circuit further comprises a second buffer circuit coupled to an output of the first driver circuit, and wherein the first and the second buffer circuits are coupled to the second signal network.

8. The circuit of claim 1, wherein the circuit is an integrated circuit, wherein the first and the second signal networks are programmable signal networks, and wherein the first driver circuit comprises at least one of a phase-locked loop circuit or a counter circuit.

9. The circuit of claim 1 further comprising:
a third signal network;
a second driver circuit to generate a sixth signal based on a seventh signal during the normal mode, wherein the seventh signal is received from the second signal network; and
a second bypass circuit coupled to the second driver circuit to provide an eighth signal generated based on the sixth signal to the third signal network during the normal mode,
wherein the second bypass circuit receives a ninth signal from the second signal network during the test mode, wherein the second bypass circuit generates a tenth signal based on the ninth signal and provides the tenth signal to the third signal network during the test mode, and wherein the tenth signal has a frequency that is less than a minimum frequency of the second driver circuit.

10. A circuit comprising:
first and second signal networks;
a first driver circuit to generate a first signal based on a second signal provided from the first signal network;
a first buffer circuit to provide a third signal generated based on the first signal to the second signal network during a normal mode; and
a second buffer circuit to generate a fourth signal based on a fifth signal provided from the first signal network during a test mode, wherein the fourth signal has a frequency that is less than a minimum frequency of the first driver circuit, wherein the fourth signal is provided to the second signal network during the test mode, and wherein the first buffer circuit prevents the first driver circuit from driving a signal to the second signal network during the test mode.

11. The circuit of claim 10 further comprising:
a third buffer circuit to generate the fourth signal based on the fifth signal provided from the first signal network during the test mode, wherein the first buffer circuit is enabled during the normal mode and disabled during the test mode, and wherein the second and the third buffer circuits are enabled during the test mode and disabled during the normal mode.

12. The circuit of claim 11 further comprising:
a first transistor coupled to the second buffer circuit and to the second signal network; and
a second transistor coupled to the third buffer circuit and to the second signal network, wherein the first and the second transistors generate the fourth signal based on output signals of the second and the third buffer circuits during the test mode.

13. The circuit of claim 12 further comprising:
a first resistor coupled between an output of the second buffer circuit and a node at a supply voltage; and
a second resistor coupled between an output of the third buffer circuit and a node at a ground voltage.

14. The circuit of claim 10 further comprising:
a frequency divider circuit to generate a sixth signal based on the second signal provided from the first signal network, wherein the first driver circuit generates the first signal based on the sixth signal during the normal mode.

15. The circuit of claim 10, wherein the first and the second signal networks are programmable.

16. The circuit of claim 10, wherein the first driver circuit comprises a phase-locked loop circuit.

17. The circuit of claim 10 further comprising:
a third signal network;
a second driver circuit to generate a sixth signal based on a seventh signal provided from the second signal network;
a third buffer circuit to provide an eighth signal generated based on the sixth signal to the third signal network during the normal mode; and
a fourth buffer circuit to generate a ninth signal based on a tenth signal provided from the second signal network during the test mode, wherein the ninth signal has a frequency that is less than a minimum frequency of the second driver circuit, and wherein the ninth signal is provided to the third signal network during the test mode.

18. A method comprising:
generating a first signal based on a second signal provided from a first signal network during a normal mode using a driver circuit;
providing a third signal generated based on the first signal to a second signal network during the normal mode using a first buffer circuit coupled to the driver circuit; and
generating a fourth signal based on a fifth signal using a second buffer circuit and providing the fourth signal to the second signal network during a test mode to bypass the driver circuit, wherein the fifth signal is provided from the first signal network, and wherein the first buffer circuit prevents the driver circuit from driving a signal to the second signal network during the test mode.

19. The method of claim 18, wherein the first buffer circuit is enabled during the normal mode and disabled during the test mode, wherein the second buffer circuit is enabled during the test mode and disabled during the normal mode, wherein the fourth signal has a frequency that is less than a minimum frequency of the driver circuit, and wherein the second buffer circuit is coupled to the driver circuit.

20. The method of claim 18, further comprising:
generating the fourth signal based on the fifth signal during the test mode using a third buffer circuit,
wherein generating a fourth signal based on a fifth signal using a second buffer circuit and providing the fourth signal to the second signal network during a test mode to bypass the driver circuit further comprises generating the fourth signal using a pull-up transistor and a pull-down transistor, wherein the pull-up transistor is coupled to an output of the second buffer circuit and to the second signal network, and wherein the pull-down transistor is coupled to an output of the third buffer circuit and to the second signal network.

21. The method of claim 18, wherein generating a fourth signal based on a fifth signal using a second buffer circuit and providing the fourth signal to the second signal network during a test mode to bypass the driver circuit further comprises:
testing connection circuits that couple together conductors in the second signal network during the test mode.

* * * * *